United States Patent
Wong et al.

(10) Patent No.: US 11,108,382 B1
(45) Date of Patent: Aug. 31, 2021

(54) OSCILLATOR CALIBRATION

(71) Applicants: ATI Technologies ULC, Markham (CA); Advanced Micro Devices, Inc., Santa Clara, CA (US)

(72) Inventors: Joyce Cheuk Wai Wong, Toronto (CA); Naeem Ibrahim Ally, Mississauga (CA); Jonathan Hauke, Austin, TX (US); Stephen Victor Kosonocky, Fort Collins, CO (US)

(73) Assignees: ATI Technologies ULC, Markham (CA); Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/030,452

(22) Filed: Sep. 24, 2020

(51) Int. Cl.
 *H03K 3/03* (2006.01)
 *H03L 7/06* (2006.01)
 *G06F 1/08* (2006.01)
 *G06F 1/10* (2006.01)
 *H03K 5/159* (2006.01)

(52) U.S. Cl.
 CPC .............. *H03K 3/0315* (2013.01); *G06F 1/08* (2013.01); *G06F 1/10* (2013.01); *H03K 5/159* (2013.01); *H03L 7/06* (2013.01)

(58) Field of Classification Search
 CPC .... H03K 3/0315; H03K 5/159; H03K 7/0372; H03K 7/0992; H03L 7/06; G06F 1/08; G06F 1/10
 USPC .................... 331/2, 46, 48, 49, 57, 183, 185
 See application file for complete search history.

(56) References Cited

U.S. PATENT DOCUMENTS

2019/0199363 A1* 6/2019 Kosonocky ............... H03L 1/00

* cited by examiner

*Primary Examiner* — Arnold M Kinkead
(74) *Attorney, Agent, or Firm* — Polansky & Associates, P.L.L.C.; Paul J. Polansky; Nathan H. Calvert (57) ABSTRACT

An oscillator circuit includes a first oscillator, a second oscillator, and a calibration circuit to calibrate the first and second oscillators. The first oscillator is supplied with a first supply voltage, and the second oscillator is supplied with a second supply voltage. The calibration includes setting a frequency control of the second oscillator at a target frequency. Then, a voltage control of the second supply voltage is adjusted incrementally until a first control value is identified at which a second oscillator output frequency matches the target frequency. Then, a voltage control of the first supply voltage is set to the first control value. Then, the voltage control for the first supply voltage is adjusted incrementally until a second control value is identified at which a first oscillator output frequency is as close to the second oscillator output frequency as is achievable, but does not exceed it.

20 Claims, 11 Drawing Sheets

OSCILLATOR CALIBRATION

BACKGROUND

A clock oscillator circuit needs to supply a stable clock signal to sequential components of an integrated circuit in order for the components to function correctly in accordance with their design. The ability of an oscillator circuit to supply such a stable clock signal may be affected by noise and/or supply droop on the power supply line. Noise such as crosstalk, electromagnetic interference, or substrate noise may cause the power supply voltage to fall below a desired voltage level or overshoot the desired voltage level. Supply droop occurs when circuits draw more current than the power supply can provide at a given time, causing the supply voltage to droop below the desired voltage. As used herein, the term "noise" may apply to both power supply noise and power supply droop.

One way to mitigate such power supply variations is to detect the variations and, in response, slow down the system clock frequency to reduce the current drawn. Another way is to add extra margin to the power supply capacity so that when there is voltage fluctuation, it is covered by the added margin and therefore does not result in violation of clock circuit timing which may cause the functional timing of the chip to fail.

Such solutions often have various shortcomings. For example, sometimes the supply voltage drops more quickly than the system is able to detect the drop and slow down the clock. Additionally, adding margins to the power supply typically results in increased power consumption overall.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

An oscillator circuit includes a first oscillator, a second oscillator, and a calibration circuit. The first oscillator is supplied with a first supply voltage, and the second oscillator is supplied with a second supply voltage. The calibration circuit calibrates the first and second oscillators. The calibration includes setting a frequency control of the second oscillator at a target frequency. Then, a voltage control of the second supply voltage is adjusted incrementally until a first control value is identified at which a second oscillator output frequency matches the target frequency. Then, a voltage control of the first supply voltage is set to the first control value. Then, the voltage control for the first supply voltage is adjusted incrementally until a second control value is identified at which a first oscillator output frequency is as close to the second oscillator output frequency as is achievable, but does not exceed it.

A system includes an integrated circuit including a clock tree and a frequency locked loop circuit that generates a system clock that drives the clock tree. The frequency locked loop circuit has an oscillator circuit including a first oscillator, a second oscillator, and a calibration circuit. The first oscillator is supplied with a first supply voltage, and the second oscillator is supplied with a second supply voltage. The calibration circuit calibrates the first and second oscillators. The calibration includes setting a frequency control of the second oscillator at a target frequency. Then, a voltage control of the second supply voltage is adjusted incrementally until a first control value is identified at which a second oscillator output frequency matches the target frequency. Then, a voltage control of the first supply voltage is set to the first control value. Then, the voltage control for the first supply voltage is adjusted incrementally until a second control value is identified at which a first oscillator output frequency is as close to the second oscillator output frequency as is achievable, but does not exceed it.

A method calibrates an oscillator circuit. The method includes setting a frequency control input of a first oscillator to a target frequency. A frequency control input of a second oscillator is set to the target frequency. After the frequency control input of the second oscillator is set, a voltage control of a second supply voltage supplying the second oscillator is adjusted incrementally until a first control value is identified at which a second oscillator output frequency matches the target frequency. Then a voltage control of a first supply voltage, supplying the first oscillator, is set to the first control value. Then, the voltage control for a first supply voltage is incrementally until a second control value is identified at which a first oscillator output frequency is as close to the second oscillator output frequency as is achievable, but does not exceed it.

Figure 1:
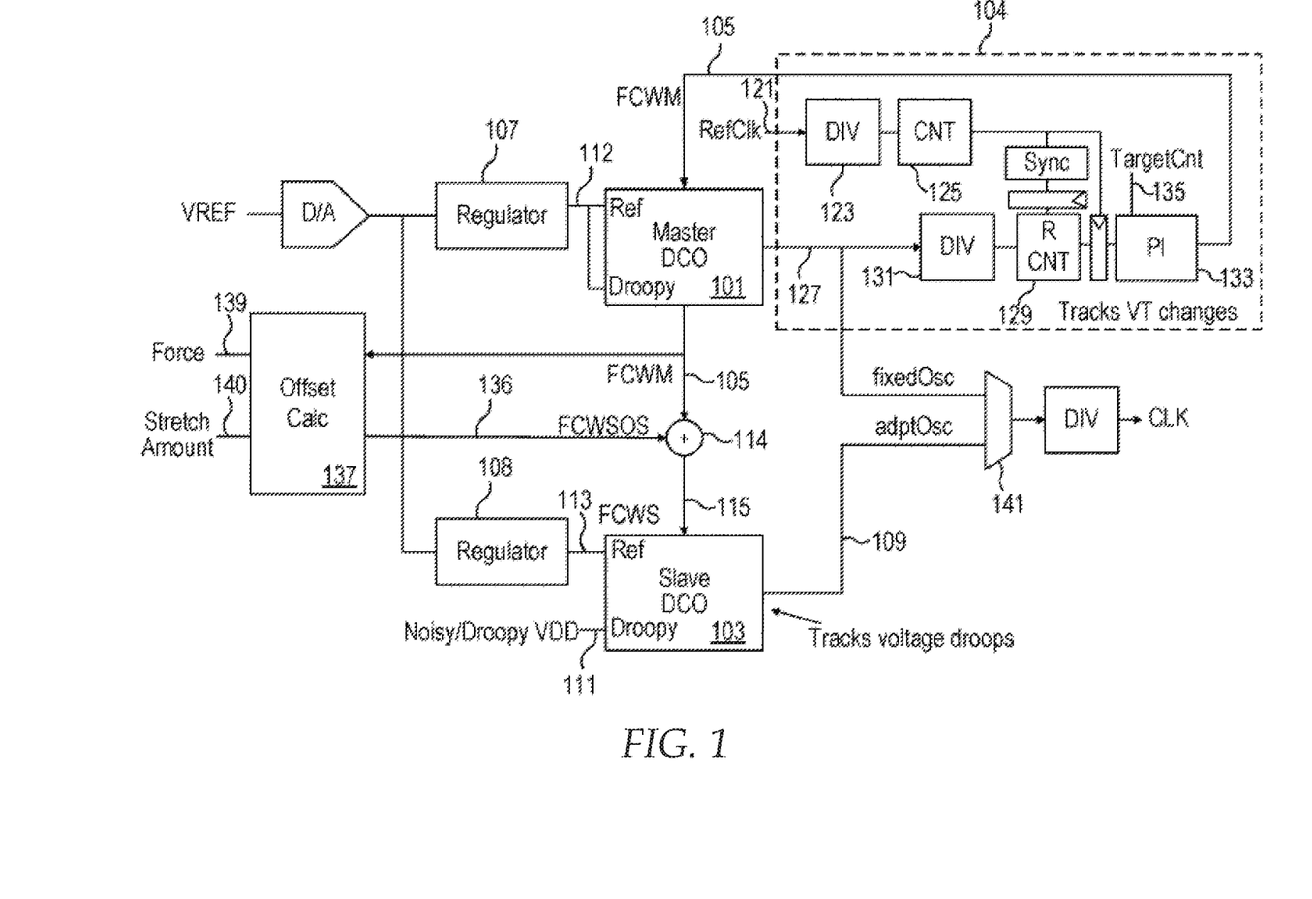
FIG. 1 illustrates in block diagram form a system including a master oscillator and a slave oscillator.

Referring to FIG. 1, an exemplary system includes a master oscillator 101 and a slave oscillator 103. In the illustrated embodiments, both the master and slave oscillators are digitally controlled oscillators (DCOs). A frequency-locked loop (FLL) that includes the master oscillator 101 and the loop control logic 104 tracks frequency changes caused by voltage and temperature changes associated with the master oscillator 101. The loop control logic 104 supplies the master oscillator with a frequency control word (FCWM) 105. The master oscillator 101 receives a regulated voltage 112 from regulator 107. That ensures that the voltage received by the master DCO 101 is much "cleaner" than the noisy or droopy VDD voltage 111 received by the slave oscillator 103. The droopy voltage may be, e.g., the voltage utilized by a processor core. The slave oscillator 103 utilizes the master oscillator control signal to control frequency and also adapts the slave oscillator output 109 to variations in the droopy voltage 111 as explained further herein.

The slave oscillator 103 receives a slave frequency control word (FCWS) 115 based on the master frequency control word FCWM from the summing circuit 114. That allows an offset to be added to the FCWM to create the slave frequency control word FCWS 115. The offset can have a value of zero in which case the slave oscillator receives the FCWM unchanged. In some embodiments, the slave and master oscillators are located in close physical proximity so PVT variations that affect the master oscillator also affect the slave oscillator. While the master and slave oscillators may be digitally controlled oscillators as shown in the embodiment of FIG. 1, in other embodiments the oscillators may be voltage or current controlled oscillators. The control signal FCWM and FCWS may be multi-bit digital signals to control the frequency of the DCOs. In other embodiments the FCWM and FCWS are voltage or current signals for analog control of the oscillators. In analog embodiments the summer circuit 114 is implemented to add or subtract voltages or currents.

Loop control logic 104 receives a reference clock 121 having a known frequency. In the illustrated embodiment the reference clock may be divided down in divider 123. A counter 125 counts a predetermined number of reference clock periods to provide a sampling window for the master oscillator clock signal 127. Counter 129 counts the master oscillator clock signal (or a divided down version) during the sampling window. In the illustrated embodiment, a divider 131 divides the master oscillator clock signal 127. A proportional and integral (PI) controller 133 receives the count of the number of divided down master oscillator clock signal periods over the sampling window and compares the sampled count value to a target count value 135. The target count value represents the target frequency for the master oscillator clock signal 127. While the illustrated embodiment utilizes a PI controller 133, other control approaches may be utilized in other embodiments. The control logic 104 may be implemented in a microcontroller or other control logic. The control loop tracks low frequency changes resulting from changes in voltage and temperature and also compensates for process variations associated with the particular die, which allows the slave oscillator 103 to be isolated from low frequency PVT variations and respond to the higher frequency voltage droops or overshoots that occur in the noisy voltage supplied to a voltage domain of an integrated circuit.

While FIG. 1 shows separate regulator blocks 107 and 108, embodiments may utilize a single regulator to supply the regulated voltage to the master and slave oscillators 101 and 103 in which case the regulated voltages 112 and 113 are the same voltage. A selector circuit 141 receives the master oscillator output signal 127 and the slave oscillator output signal 109. The selector circuit may select the master oscillator signal to be output from selector circuit 141 for test purposes. If master oscillator 101 is on a voltage supply that is shut off and the clock is still needed by other logic, the clock signal from the master oscillator can be selected operationally.

Figure 2:
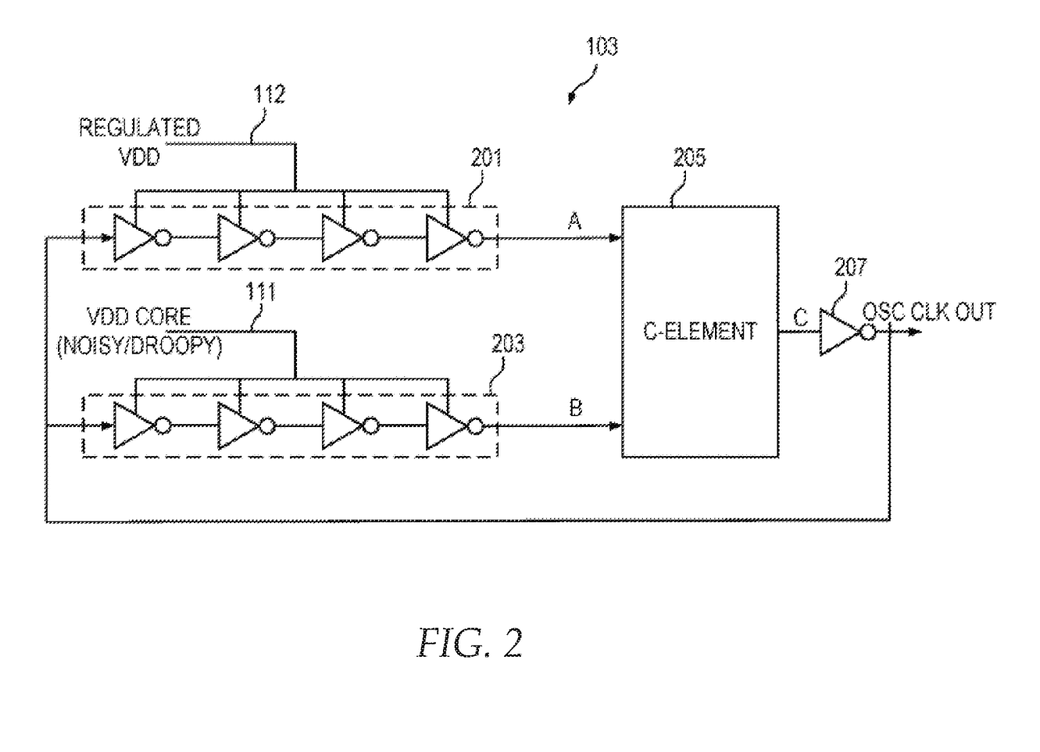
FIG. 2 illustrates a high level block diagram of an embodiment of a slave oscillator.

FIG. 2 illustrates a high level block diagram of an exemplary slave oscillator 103 that functions as an adaptive oscillator to slow down system clocks in response to a voltage droop and to limit the frequency response to voltage overshoots. The adaptive slave oscillator 103 includes a reference delay line 201 that operates with the regulated voltage VDD 112 and a droopy delay line 203 that operates with the noisy/droopy voltage 111. The voltage supplied to delay line 201 is "clean" and the clock signal A should be more stable than clock signal B. The delay line 203 outputs a clock signal B that varies in frequency with the droopy voltage. When the droopy voltage 111 droops, the delay line slows down and when the droopy voltage increases, the delay line speeds up. Note that the inverter 207 forms the fifth inverter to ensure each of the delay lines 201 and 203 functions as an oscillator.

Figure 3:
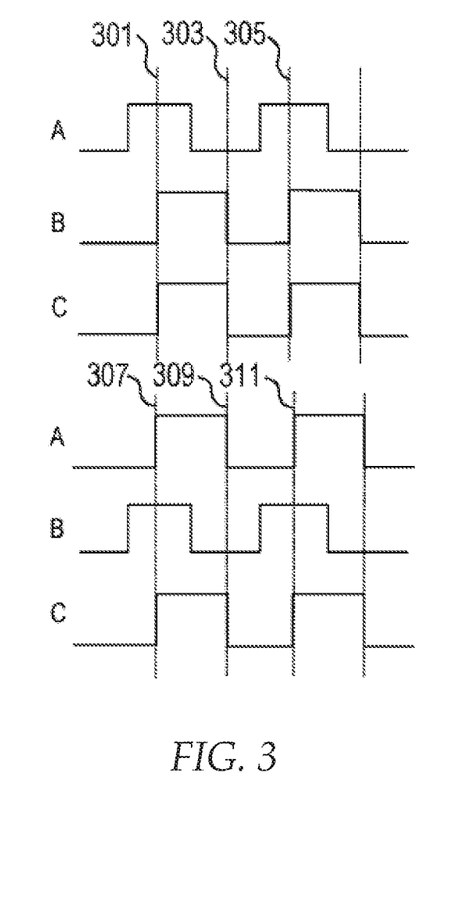
FIG. 3 illustrates a timing diagram illustrating operation of the C-element of the slave oscillator.

As shown in FIG. 3, the C-element logic 205 outputs an output signal C with a logic high when both inputs A and B are high at 301. The C-element logic 205 keeps the output signal C high until both inputs A and B are low at 303. Once the output C is a logic low, the C-element maintains the output C low until both inputs again become high at 305. As shown in FIG. 3 when clock signal A leads clock signal B, clock signal C is the same as clock signal B. When clock signal B leads clock signal A, clock signal C is the same as clock signal A. Thus, the C-element logic 205 outputs a logic high output signal C when both inputs A and B are high at 307 and keeps the output C high until both inputs become low at 309. Once the output C is a logic low, the C-element maintains the output C low until both inputs again become high at 311. In other words, the logic 205 selects the latest pulse to output.

Figure 4:
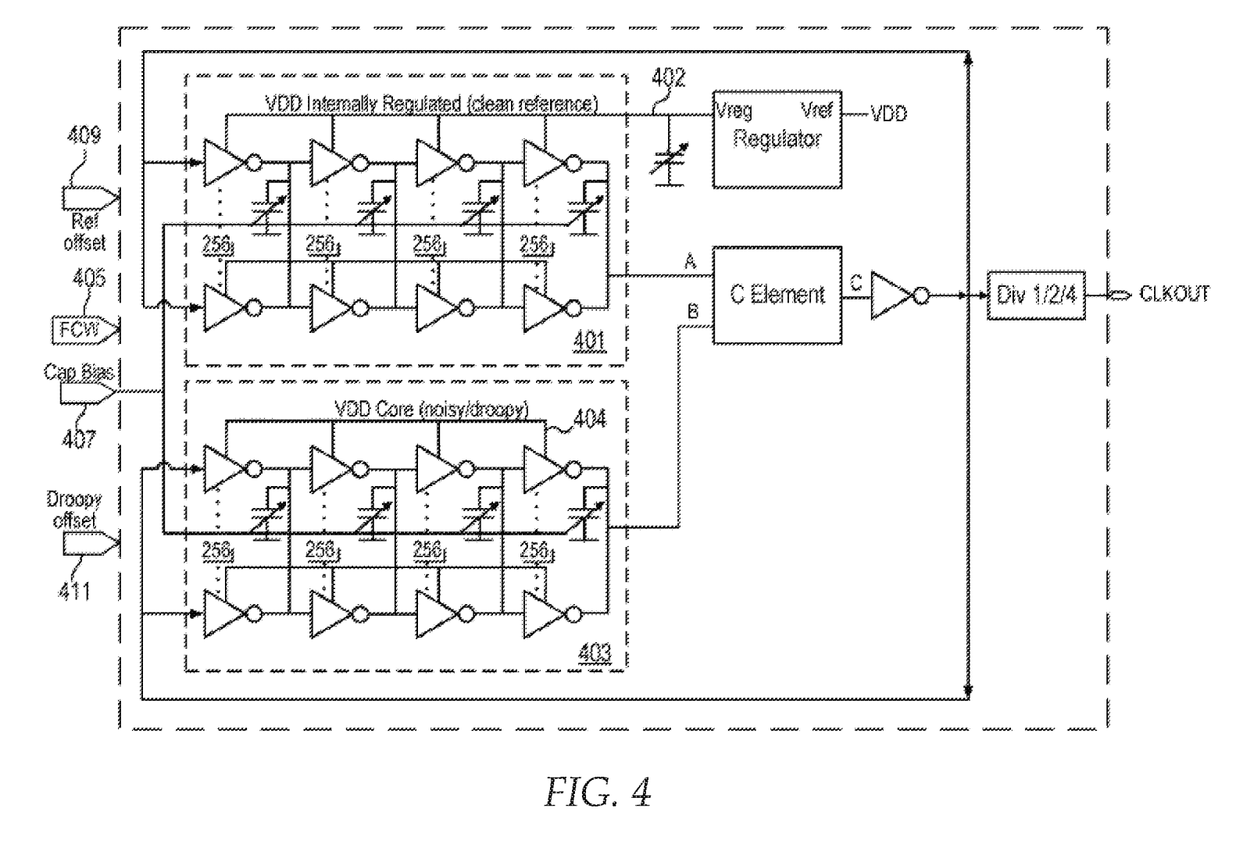
FIG. 4 illustrates a high level block diagram showing additional details of an embodiment of a slave oscillator.

FIG. 4 shows a more detailed view of an embodiment of the adaptive slave oscillator 103. The embodiment includes a reference delay line 401 that receives a regulated voltage 402 and a droopy delay line 403 that receives a droopy voltage 404. Each of the delay lines has a number of rows of delay elements that can be turned on or off. The more rows that are turned on, the faster the delay element operates. In an embodiment the delay lines 401 and 403 have 128 rows. Other embodiments can have other numbers of rows. Embodiments may use tristate inverters shown in FIG. 4, buffers, or other forms of delay elements. In addition, while single-ended embodiments are illustrated, other embodiments may utilize differential delay lines.

A frequency control word (FCW) 405 selects how many rows in each of the delay lines are enabled and therefore the output frequency of each of the delay lines. In the illustrated embodiment a bias setting 407 controls the variable capacitors in each of the delay lines. In addition, an offset value 409 can be used to adjust the FCW 405 supplied to the reference delay line 401 if desired. The droopy delay line 403 receives an offset value 411 that can be used to adjust the FCW 405 supplied to the droopy delay line 403. The offset logic for the reference delay line and the droopy delay line is not shown for ease of illustration. The embodiment illustrated in FIG. 4 effectively deals with high frequency noise such as voltage droop but does not work well for low frequency noise. In fact, the circuit of FIG. 4 may lock onto low frequency noise and fail to compensate for the noise. Utilizing the master oscillator control loop (see FIG. 1) more effectively compensates for low frequency noise in the system.

In an embodiment, the master oscillator 101 (FIG. 1) includes two delay lines such as shown in FIG. 4. However, rather than one of the delay lines receiving a regulated voltage supply and one of the delay lines receiving a droopy voltage supply, each of the delay lines receives the regulated voltage supply. Thus, in such an embodiment, the C-element output reflects both the delay lines of master oscillator 101.

Referring back to FIG. 1 the summer circuit 114 forms the slave control word FCWS 115 from the master frequency control word FCWM 105 and an offset value 136 generated in offset calculation logic 137. The offset calculation logic receives inputs 139 and 140 that cause the offset calculation logic to increase or decrease the offset value 136 supplied to summer circuit 114 to thereby increase or decrease the FCWM 105 before it is supplied to the slave oscillator 103. The offset value 136 may be zero in which case the slave oscillator uses the master frequency control word 105 without alteration. In certain situations, e.g., a detected current excursion, e.g., a current overshoot or undershoot, offset calculation logic 137 receives a force signal 139 to adjust the frequency supplied by the slave oscillator by adding or subtracting an offset from the master frequency control word depending on the direction of the current excursion. Other situations may result in a nonzero offset. For example, two independent clock domains may be operating in the integrated circuit and the domain supplied by the slave DCO 103 may need to slow down in order to avoid overrunning a FIFO in the other clock domain. In addition, the offset may be used to effect various power management outcomes to speed up or reduce the clock frequency supplied by the slave oscillator. In the illustrated embodiment, the offset calculation logic 137 receives the master frequency control word 105 in order to help determine an appropriate offset amount. While shown separately, the summer 114 and offset calculation logic 137 may be combined and supply the modified FCWM as the FCWS. In an embodiment, the slave oscillator 103 has two offset calculation blocks 137 (only one shown) and two summing circuits 114 (only one shown). One of the offset calculation blocks and summing circuit is for the reference delay line (e.g., 201, 401 in FIGS. 2 and 4) and the other offset calculation block and summing circuit is for the droopy delay line (see, e.g., 203, 403 in FIGS. 2 and 4). That allows for independent adjustment of the frequency of the slave reference and droopy delay lines that are otherwise controlled by the master frequency control word.

Figure 5:
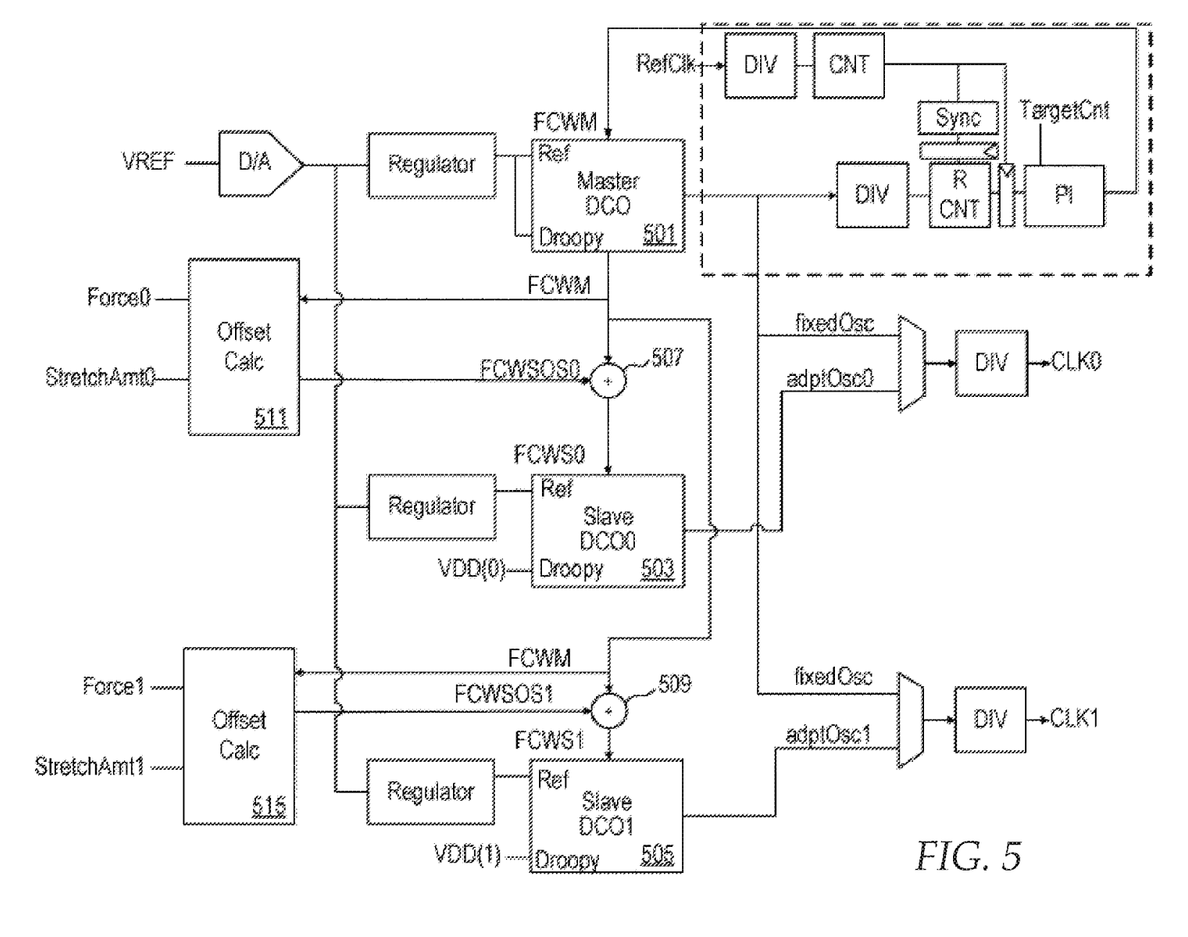
FIG. 5 illustrates a high level block diagram of an embodiment in which a master oscillator controls multiple slave oscillators.

FIG. 5 illustrates an embodiment in which master oscillator 501 controls two slave oscillators 503 and 505. Slave oscillator 503 receives the master frequency control word (FCWM) through a summer circuit 507 and slave oscillator 505 receives the master frequency control word (FCWM) through a summer circuit 509. Slave oscillator 503 receives droopy voltage VDD(0) and slave oscillator 505 receives droopy voltage VDD(1). VDD(0) and VDD(1) can be derived from a common input voltage rail but utilized in separately controlled voltage and clock domains. For example, one voltage domain may be turned off while the other voltage domain remains powered. The two slave oscillators may receive different reference voltages. Separate offset calculation blocks 511 and 515 independently determine any required offsets for the two slave oscillators frequency control words FCWS0 and FCWS1.

Figure 6:
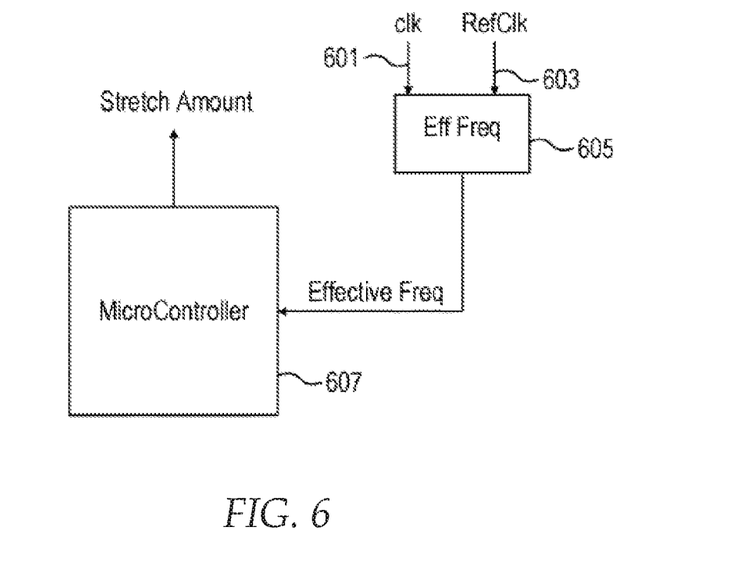
FIG. 6 illustrates an embodiment of a control structure to generate offsets for the slave oscillator.
Figure 7:
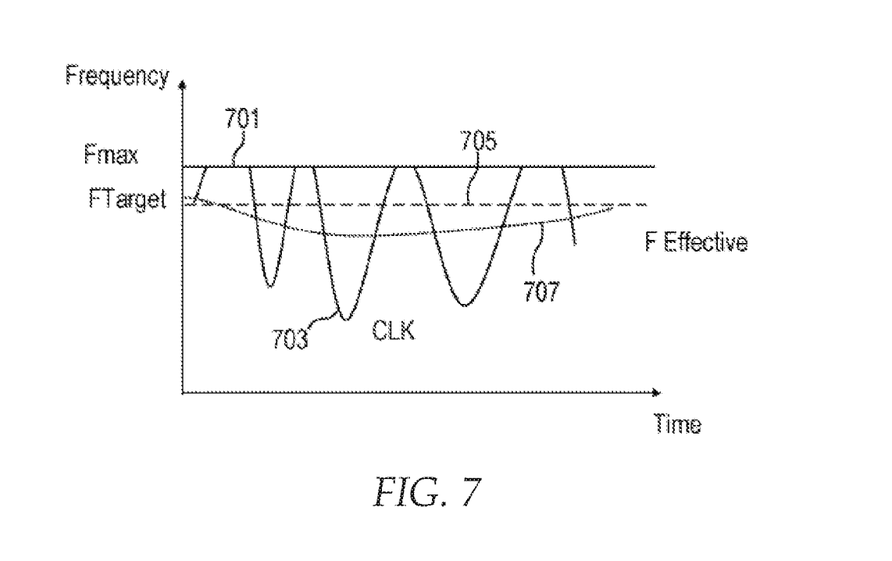
FIG. 7 illustrates how the effective frequency can be tracked and adjusted by a control loop to be closer to a target frequency.

FIGS. 6 and 7 provide an example of how the Stretch Amount may be determined and supplied to the offset calculation logic 137 (FIG. 1). In addition to the control loop 104, the clock logic may include logic to determine an effective frequency of the slave oscillator over a predetermined time period. The slave oscillator output signal 601 and a known reference clock signal 603 are supplied to an effective frequency calculation logic 605. The effective frequency calculation logic counts the number of slave oscillator clock cycles that occur over a predetermined number of reference clock cycles in order to determine an effective frequency. The number of reference clock cycles corresponds to a particular time period, e.g., 10 ms. A microcontroller 607 may operate a proportional integral derivative (PID), a PI control loop, or another form of control to control the effective frequency.

Referring to FIG. 7, the control logic sets a maximum frequency Fmax 701. Curve 703 represents the actual frequency. As can be seen the actual frequency is limited by the maximum frequency. The controller may ensure that the frequency is limited to the maximum frequency using the stretch amount input 140 to the offset calculation logic 137 to limit the frequency (see FIG. 1) by reducing the frequency control word and slowing down the slave oscillator. The target frequency is shown as 705. If over time the effective frequency 707 is too far below the target frequency 705, the stretch amount input 140 can be used to increase the frequency of the slave oscillator and over time increase the effective frequency to be closer to the target frequency as shown in FIG. 7. When the effective frequency is above the target frequency, the effective frequency can be reduced using the offset calculation logic to adjust the slave frequency control word to reduce the slave oscillator frequency. In addition to controlling frequency through the offset applied to the master frequency control word, the controller can also increase or decrease VDD in response to the effective frequency being above or below a target value.

Figure 8:
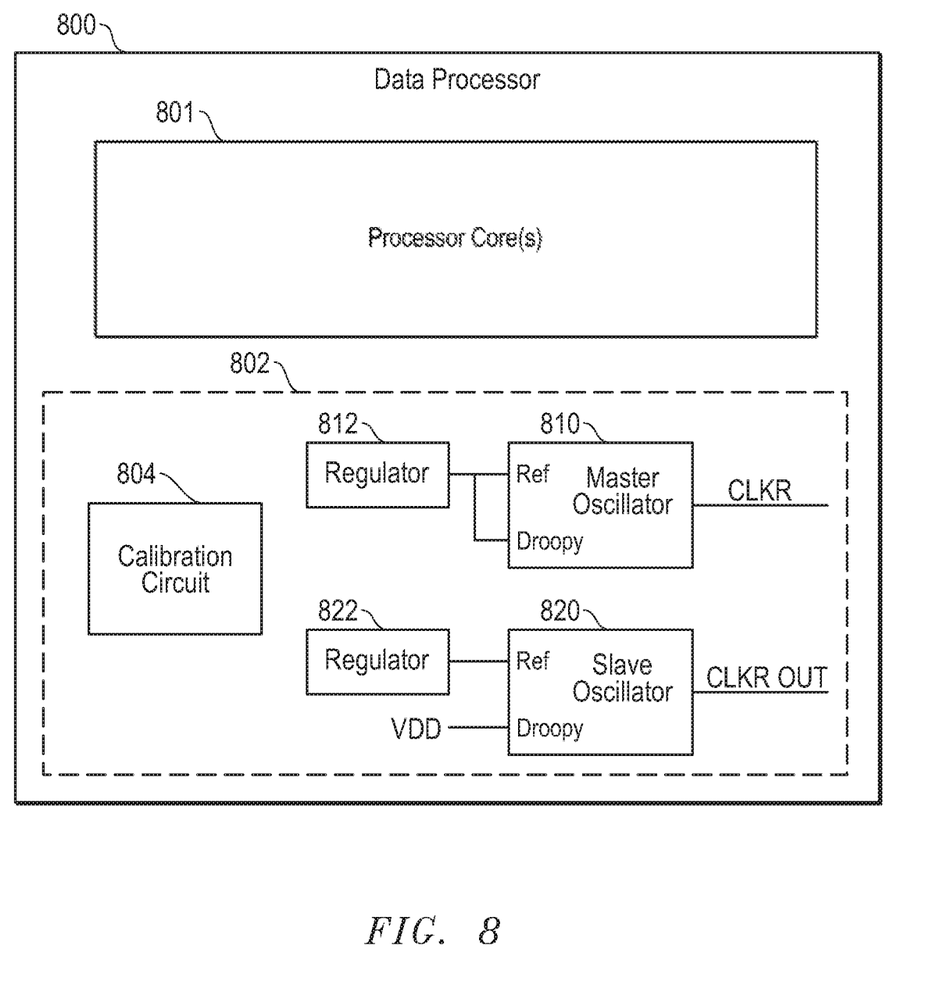
FIG. 8 illustrates a block diagram of a data processing system including an oscillator circuit including a calibration circuit according to some embodiments.

FIG. 8 illustrates in block diagram form a data processor 800 including an oscillator circuit 802 with a calibration circuit 804 according to some embodiments. Data processor 800 is embodied on an integrated circuit and includes one or more processor cores 801, which operate with a system clock signal provided by a clock tree (not shown separately) driven by oscillator circuit 802.

Oscillator circuit 802 includes a master oscillator 810 and a slave oscillator 820 each formed as an adaptive oscillator as described above. Master oscillator 810 is supplied with a first supply voltage from regulator 812, and slave oscillator 820 is supplied with a second supply voltage from regulator 822. A calibration circuit 804 is employed to calibrate oscillators 810 and 820. A frequency locked loop such as the control loop of FIG. 6 is employed to control oscillator circuit 802. The use of such frequency locked loops may result in overshoot or undershoot with respect to a target frequency. Calibration circuit 804 helps to mitigate such overshoot and undershoot, and create a customized voltage response curve that can be tuned based on the system's requirements. Master oscillator 810 produces a reference clock signal CLKR and slave oscillator 820 produces an output clock signal CLK OUT. In this embodiment, individual voltage settings are used for regulators 812 and 822 supplying the master and slave portions. This decoupling of voltage settings provides ability to fine-tune the control response, providing for shaping of the voltage-frequency response curve via post-silicon calibration. The calibration process performed by calibration circuit 804 is further described below with regard to FIGS. 9-12.

Figure 9:
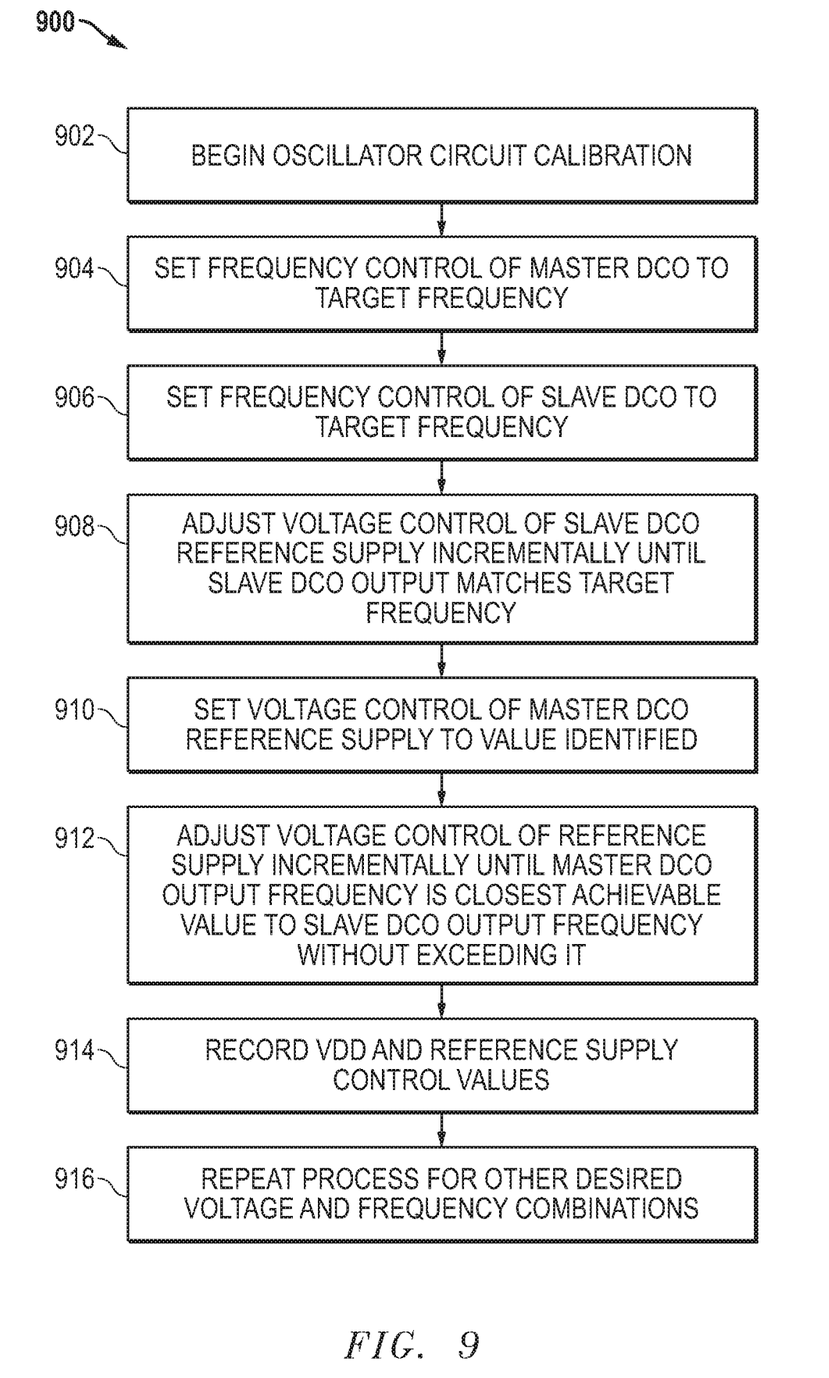
FIG. 9 is a flow chart illustrating a process of calibrating an oscillator circuit according to some embodiments.

FIG. 9 is a flow chart illustrating a process 900 of calibrating an oscillator circuit according to some embodiments. Process 900 is suitable for use with the various embodiments of oscillator circuits described herein, and other embodiments. Process 900 is preferably performed under control of a calibration circuit such as calibration circuit 804 (FIG. 8) connected to an oscillator circuit driving suitable digital logic or a microprocessor.

Process 900 begins the oscillator circuit calibration at block 902. A target frequency at which to perform the calibration is provided to the calibration circuit. The calibration may be repeated for multiple target frequencies. At block 904, the target frequency is set at a first digitally controlled oscillator (DCO), such as master oscillator 810 (FIG. 8). At block 906, the target frequency is set at a second DCO, such as slave oscillator 820. The exact target frequency may be determined by disabling the reference delay line of the second oscillator and measuring the output frequency of the second oscillator operating with the droopy delay line. Then the reference delay line is enabled and the droopy delay line disabled.

Figure 10:
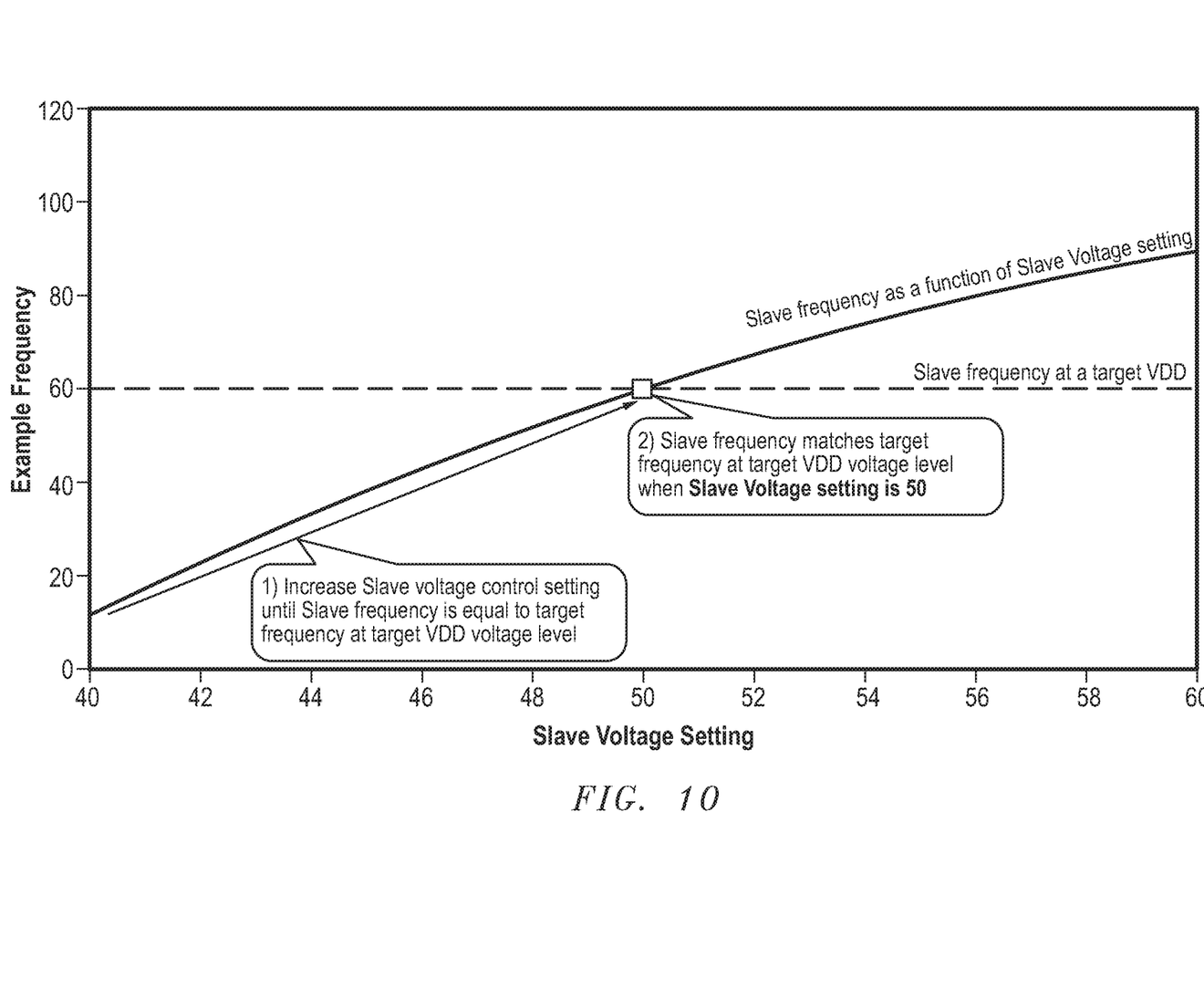
FIG. 10 is a graph illustrating an example scenario for a voltage adjustment in the process of FIG. 9.

At block 908, process 900 adjusts a voltage control of the second supply voltage incrementally until a first control value is identified at which the second oscillator output frequency matches the target frequency. In embodiments in which the second oscillator includes two delay lines as depicted in FIG. 8, this block is performed with the droopy delay line disabled and the oscillator operating with the reference delay line. FIG. 10 is a graph depicting an example scenario for voltage adjustment of block 908. The output frequency of the slave oscillator is shown on the vertical axis while the horizontal axis shows the voltage setting of the reference voltage regulator for the slave oscillator (for example, regulator 822, FIG. 8). In the depicted scenario, the initial voltage control setting for the slave oscillator results in a frequency below the target frequency, as shown at the label "1". The voltage control setting is increased until the slave oscillator frequency matches the target frequency, as shown at the label "2". The identified first control value is the voltage control value which results in the match, in this example a value of 50. In other scenarios downward adjustments may be required.

Returning to FIG. 9, at block 910, the voltage control of the first supply voltage is set to the first control value identified at block 908. Then at block 912, process 900 adjusts the voltage control for reference voltage regulator (i.e., 812, FIG. 8) incrementally until a second control value is identified at which the master oscillator output frequency is as close to the slave oscillator output frequency as is achievable, but does not exceed it.

Figure 11:
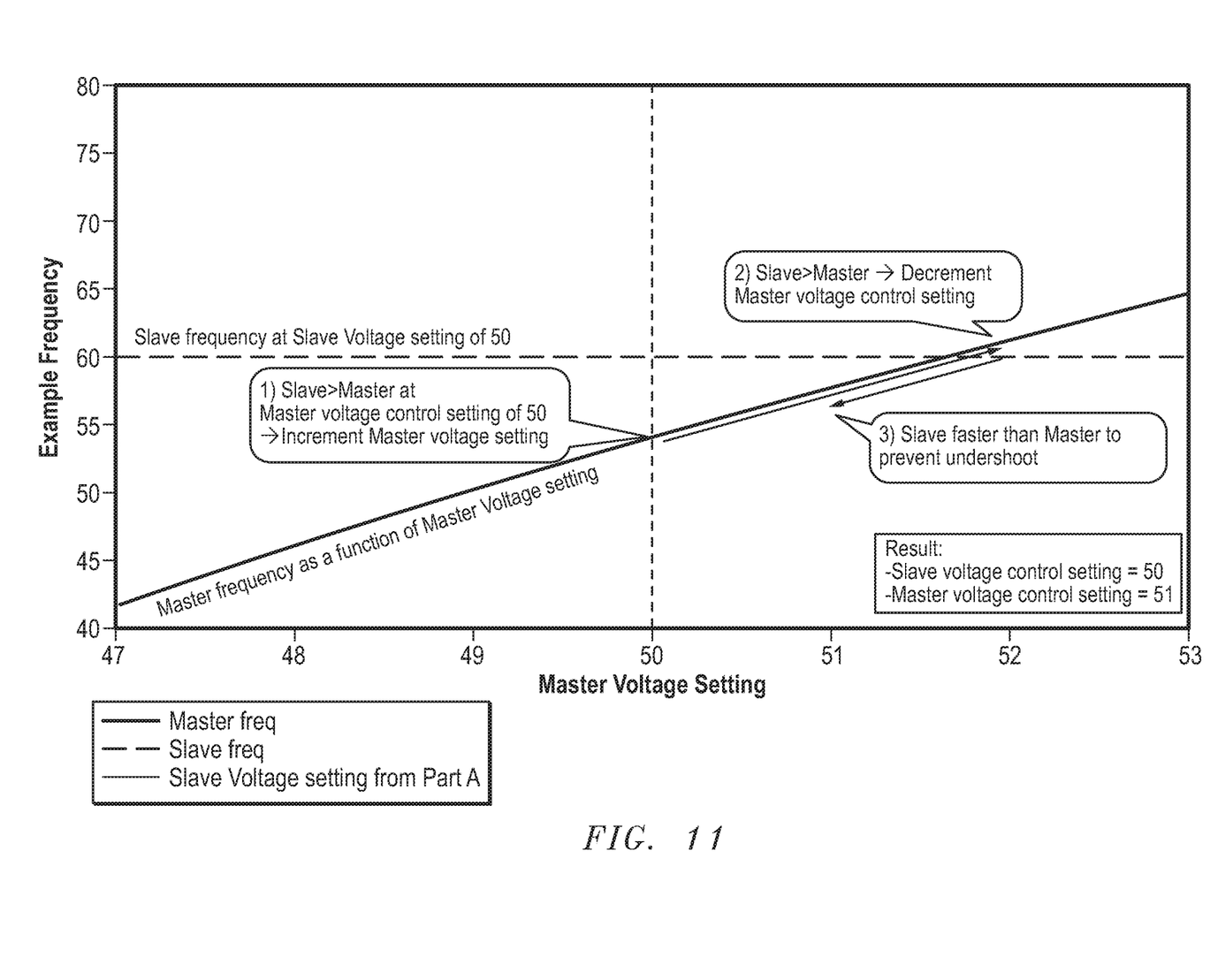
FIG. 11 is a graph illustrating an example scenario for another voltage adjustment in the process of FIG. 9.

FIG. 11 is a graph depicting an example scenario for voltage adjustment of block 912. In the depicted scenario, the voltage control value initially results in a regulator voltage producing an output frequency for the master oscillator that is less than that of the slave oscillator, as shown at label "1". The voltage control setting is then incrementally increased until the master oscillator frequency becomes greater than the slave oscillator frequency as shown at label "2". In this state, while the two oscillators are close in frequency, overshoot may result from the dual oscillator control process employed. To mitigate such overshoot, the voltage control for the master oscillator is adjusted downward until the slave oscillator output frequency higher than or equal to the master oscillator output frequency, as shown at label "3". Ideally the two frequencies are calibrated to be equal. However, due to the discrete incremental nature of the digital voltage control, an exact match is often not possible.

Figure 12:
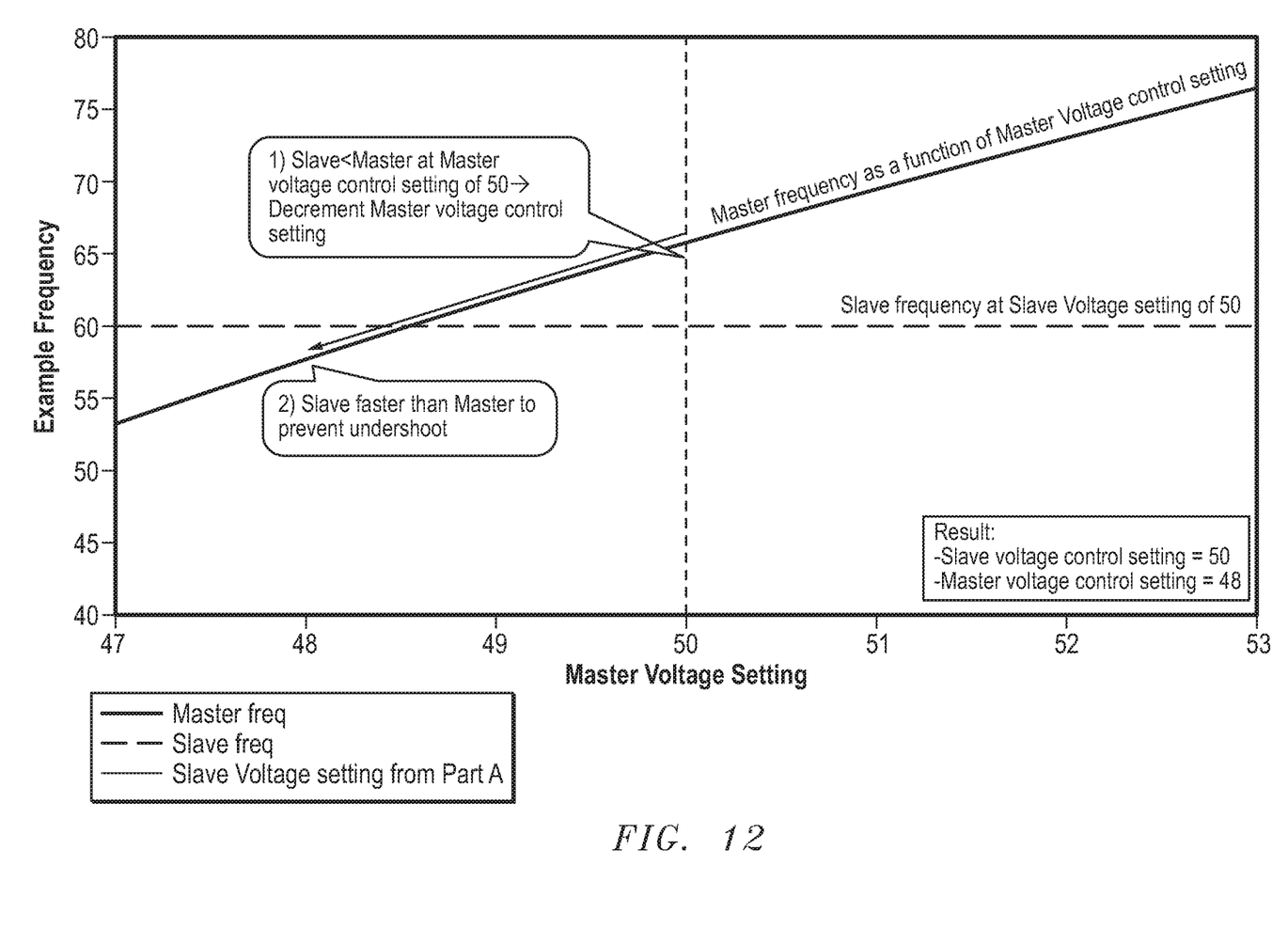
FIG. 12 is a graph illustrating different example scenario for voltage adjustment of FIG. 11.

FIG. 12 is a graph depicting another example scenario for voltage adjustment of block 912, different from that of FIG. 11. In the depicted scenario, the voltage control value initially results in a regulator voltage producing an output frequency for the master oscillator that is greater than that of the slave oscillator, as shown at label "1". The voltage control setting is then incrementally decreased until the master oscillator frequency becomes less than or equal to the slave oscillator frequency as shown at label "2".

Referring again to FIG. 9, at block 914 the control values resulting from blocks 908 and 912 are recorded for use when the oscillator circuit is set to the target frequency and/or operating voltages. When such setting occurs, the master and slave reference voltage regulators (i.e., 812, 822, FIG. 8) are set to the recorded values and the oscillator circuit is then controlled by its feedback control loop.

At block 916, process 900 repeats the calibration process of blocks 904-914 for each desired target frequency. If different operating voltages are employed at different target frequencies, the calibration process is also repeated for combinations of operating voltage and frequency. Preferably, calibration circuit 804 calibrates the master and slave oscillators each time the oscillator circuit integrated circuit is reset. For many embodiments such calibration is suitable because operating conditions, such as temperature, change over time, and the integrated circuit may suffer from migration effects and other long-term changes which alter the performance of the oscillator circuit.

Benefits, other advantages, and solutions to problems have been described above with regards to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

The circuits herein or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. Accordingly, it is intended by the appended claims to cover all modifications of the disclosed embodiments that fall within the scope of the disclosed embodiments.

What is claimed is:
1. An oscillator circuit comprising:
a first oscillator supplied with a first supply voltage;
a second oscillator supplied with a second supply voltage;
a calibration circuit operable to calibrate the first and second oscillators by:

(a) setting a frequency control of the second oscillator at a target frequency;
(b) after (a), adjusting a voltage control of the second supply voltage incrementally until a first control value is identified at which a second oscillator output frequency matches the target frequency;
(c) after (b), setting a voltage control of the first supply voltage to the first control value; and
(d) after (c), adjusting the voltage control for the first supply voltage incrementally until a second control value is identified at which a first oscillator output frequency is as close to the second oscillator output frequency as is achievable, but does not exceed it.

2. The oscillator circuit of claim 1, wherein the calibration circuit is further operable to perform paragraphs (a)-(d) and record resulting first and second control values for use at each of a plurality of different operating voltages.

3. The oscillator circuit of claim 1, wherein the calibration circuit, when adjusting the voltage control for the first supply voltage, checks if the first oscillator output frequency is higher than the second oscillator output frequency, and if so, adjusts the voltage control for the first supply voltage incrementally downward until it is not, and if not, adjusts the voltage control for the first supply voltage incrementally upward until it is so, and then downward one increment.

4. The oscillator circuit of claim 1, wherein each oscillator comprises first and second delay lines coupled to an edge detector.

5. The oscillator circuit of claim 1, wherein the second oscillator comprises a first delay line supplied with a third supply voltage, a second delay line supplied with the second supply voltage, and an edge detector receiving outputs of the first and second delay lines.

6. The oscillator circuit of claim 5, wherein the calibration circuit is operable to determine the target frequency by disabling the second delay line and measuring the output frequency of the second oscillator operating with the first delay line.

7. The oscillator circuit of claim 1, wherein the calibration circuit calibrates the first and second oscillators each time the oscillator circuit is reset.

8. A system comprising:
an integrated circuit including a clock tree;
a frequency locked loop circuit that generates a system clock that drives the clock tree;
wherein the frequency locked loop circuit has an oscillator circuit comprising:
a first oscillator supplied with a first supply voltage;
a second oscillator supplied with a second supply voltage;
a calibration circuit operable to calibrate the first and second oscillators by:
(a) setting a frequency control of the second oscillator at a target frequency;
(b) after (a), adjusting a voltage control of the second supply voltage incrementally until a first control value is identified at which a second oscillator output frequency matches the target frequency;
(c) after (b), setting a voltage control of the first supply voltage to the first control value; and
(d) after (c), adjusting the voltage control for the first supply voltage incrementally until a second control value is identified at which a first oscillator output frequency is as close to the second oscillator output frequency as is achievable, but does not exceed it.

9. The system of claim 8, wherein the calibration circuit is further operable to perform paragraphs (a)-(d) and record resulting first and second control values for use at each of a plurality of different operating voltages.

10. The system of claim 8, wherein the calibration circuit, when adjusting the voltage control for the first supply voltage, checks if the first oscillator output frequency is higher than the second oscillator output frequency, and if so, adjusts the voltage control for the first supply voltage incrementally downward until it is not, and if not, adjusts the voltage control for the first supply voltage incrementally upward until it is so, and then downward one increment.

11. The system of claim 8, wherein each oscillator comprises first and second delay lines coupled to an edge detector.

12. The system of claim 8, wherein the second oscillator comprises a first delay line supplied with a third supply voltage, a second delay line supplied with the second supply voltage, and an edge detector receiving outputs of the first and second delay lines.

13. The system of claim 12, wherein the calibration circuit is operable to determine the target frequency by disabling the second delay line and measuring the output frequency of the second oscillator operating with the first delay line.

14. The system of claim 8, wherein the calibration circuit calibrates the first and second oscillators each time the oscillator circuit is reset.

15. A method of calibrating an oscillator circuit comprising:
(a) setting a frequency control input of a first oscillator to a target frequency;
(b) setting a frequency control input of a second oscillator to the target frequency;
(c) after (b), adjusting a voltage control of a second supply voltage, which supplies the second oscillator, incrementally until a first control value is identified at which a second oscillator output frequency matches the target frequency;
(d) after (c), setting a voltage control of a first supply voltage, supplying the first oscillator, to the first control value; and
(e) after (d), adjusting the voltage control for a first supply voltage incrementally until a second control value is identified at which a first oscillator output frequency is as close to the second oscillator output frequency as is achievable, but does not exceed it.

16. The method of claim 15, further comprising performing paragraphs (a)-(d) and recording resulting first and second control values for use at each of a plurality of different operating voltages.

17. The method of claim 15, further comprising when adjusting the voltage control for the first supply voltage, checking if the first oscillator output frequency is higher than the second oscillator output frequency, and if so, adjusting the voltage control for the first supply voltage incrementally downward until it is not, and if not, adjusting the voltage control for the first supply voltage incrementally upward until it is so, and then downward one increment.

18. The method of claim 15, further comprising calibrating the first and second oscillators as described in paragraphs (a)-(e) each time the oscillator circuit is reset.

19. The method of claim 15, further comprising supplying a first delay line of the second oscillator with a third supply voltage which is a droopy supply voltage, and supplying a second delay line of the second oscillator with the second supply voltage.

20. The method of claim 19, further comprising determining the target frequency by disabling the second delay line and measuring the output frequency of the second oscillator operating with the first delay line.

* * * * *